(12) United States Patent
Kobilka et al.

(10) Patent No.: US 10,310,374 B2
(45) Date of Patent: Jun. 4, 2019

(54) REPATTERNABLE NANOIMPRINT LITHOGRAPHY STAMP

(71) Applicant: International Business Machines Corporation, Armonk, NY (US)

(72) Inventors: Brandon M. Kobilka, Tucson, AZ (US); Joseph Kuczynski, North Port, FL (US); Jason T. Wertz, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 15/239,875

(22) Filed: Aug. 18, 2016

(65) Prior Publication Data

US 2018/0052389 A1 Feb. 22, 2018

(51) Int. Cl.
*G03F 7/00* (2006.01)
*H01F 1/00* (2006.01)
*H01F 41/30* (2006.01)

(52) U.S. Cl.
CPC ......... *G03F 7/0002* (2013.01); *H01F 1/0045* (2013.01); *H01F 41/30* (2013.01)

(58) Field of Classification Search
CPC ..... B81C 2201/0159; B81C 2201/0156; Y10S 977/887; G05B 2219/45227; G03F 7/0002
USPC ............... 438/947; 428/842.2, 842.6, 843.6; 427/510, 547, 598; 110/93.01
See application file for complete search history.

(56) References Cited

U.S. PATENT DOCUMENTS

| | | | |
|---|---|---|---|
| 3,002,847 A * | 10/1961 | Shaffer | H05K 3/048 |
| | | | 118/505 |
| 4,661,408 A | 4/1987 | Lau et al. | |
| 8,802,747 B2 | 8/2014 | Xu et al. | |
| 8,859,059 B2 | 10/2014 | Naaman et al. | |
| 9,290,641 B2 | 3/2016 | Herzog et al. | |
| 2006/0007526 A1* | 1/2006 | Cannas | G09F 9/375 |
| | | | 359/296 |
| 2008/0131623 A1* | 6/2008 | Zhang | B82Y 10/00 |
| | | | 427/569 |
| 2011/0236948 A1* | 9/2011 | Naaman | B81C 1/00031 |
| | | | 435/173.2 |

(Continued)

FOREIGN PATENT DOCUMENTS

| | | |
|---|---|---|
| CN | 103285791 B | 9/2013 |
| WO | WO2003058649 A1 | 7/2003 |
| WO | WO2015118943 A1 | 8/2015 |

OTHER PUBLICATIONS

Fuhrmann, "Stamp Fabrication", Slide 11, Recent Developments in Nanoimprint-Lithography, Seminar Oct. 5, 2004, Martin Luther University Interdisciplinary Centre for Materials Science, Halle, Germany (online) [accessed Jun. 13, 2016], URL: http://www.cmat.uni-halle.de/publicationen/Fuhrmann04.pdf.

(Continued)

*Primary Examiner* — Tabassom Tadayyon Eslami
(74) *Attorney, Agent, or Firm* — Peter J. Edwards

(57) ABSTRACT

A repatternable nanoimprint lithography stamp includes a magnetic substrate and magnetic core nanoparticles. The magnetic substrate includes a magnet and a magnetic mask, and the magnetic core nanoparticles are arranged in a pattern on a surface of the magnetic substrate. The pattern is defined by selective application of a magnetic field to the magnetic substrate using the magnet and the magnetic mask.

18 Claims, 4 Drawing Sheets

(56) References Cited

U.S. PATENT DOCUMENTS

2013/0302567 A1* 11/2013 Chuang .................. B29C 41/14
　　　　　　　　　　　　　　　　　　　　　　　　　428/156
2014/0315293 A1　10/2014　Naaman et al.

OTHER PUBLICATIONS

Naaman et al., "Magnetolithography", Chemical Surface Patterning Research, Weizmann Institute of Science, Department of Chemical Physics, Molecular Electronics Group, Rehovot, Israel (online), 3 pages, [accessed Jun. 13, 2016], URL: https://www.weizmann.ac.il/chemphys/naaman/content/research-1.

* cited by examiner

REPATTERNABLE NANOIMPRINT LITHOGRAPHY STAMP

BACKGROUND

Nanoimprint stamping is a process that is used to fabricate nano-sized features and patterns. Generally, nanoimprint stamping creates a mechanical deformation in a substrate material that has been heated above the glass transition temperature of the substrate material. Nanoimprint stamping is a commonly employed technique for nanoimprint lithography. Typically, stamps are made with a single pattern, requiring multiple stamps in order to form different architectures across a surface.

SUMMARY

According to an embodiment, a repatternable nanoimprint lithography stamp is disclosed. The repatternable nanoimprint lithography stamp includes a magnetic substrate and magnetic core nanoparticles. The magnetic substrate includes a magnet and a magnetic mask, and the magnetic core nanoparticles are arranged in a pattern on a surface of the magnetic substrate. The pattern is defined by selective application of a magnetic field to the magnetic substrate using the magnet and the magnetic mask.

According to another embodiment, a process includes forming a patterned magnetic substrate that includes magnetic core nanoparticles arranged in a pattern on a surface of a magnetic substrate. The magnetic substrate includes a magnet and a magnetic mask, and the pattern of the magnetic core nanoparticles is defined by selective application of a magnetic field to the magnetic substrate using the magnet and the magnetic mask. The process also includes utilizing the patterned magnetic substrate as a repatternable nanoimprint lithography stamp.

According to another embodiment, a nanoimprint lithography process is disclosed. The process includes forming a patterned magnetic substrate that includes magnetic core nanoparticles arranged in a first pattern on a surface of a magnetic substrate. The magnetic substrate includes a magnet and a magnetic mask, and the first pattern of the magnetic core nanoparticles is defined by selective application of a magnetic field to the magnetic substrate using the magnet and the magnetic mask. The process also includes utilizing the patterned magnetic substrate to perform a first nanoimprint lithography stamping operation. The process further includes removing the magnetic core nanoparticles from the surface of the magnetic substrate by reversing a polarity of the magnetic field. The process also includes forming a second patterned magnetic substrate that includes magnetic core nanoparticles arranged in a second pattern on the surface of the magnetic substrate. The process further includes utilizing the second patterned magnetic substrate to perform a second nanoimprint lithography operation.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
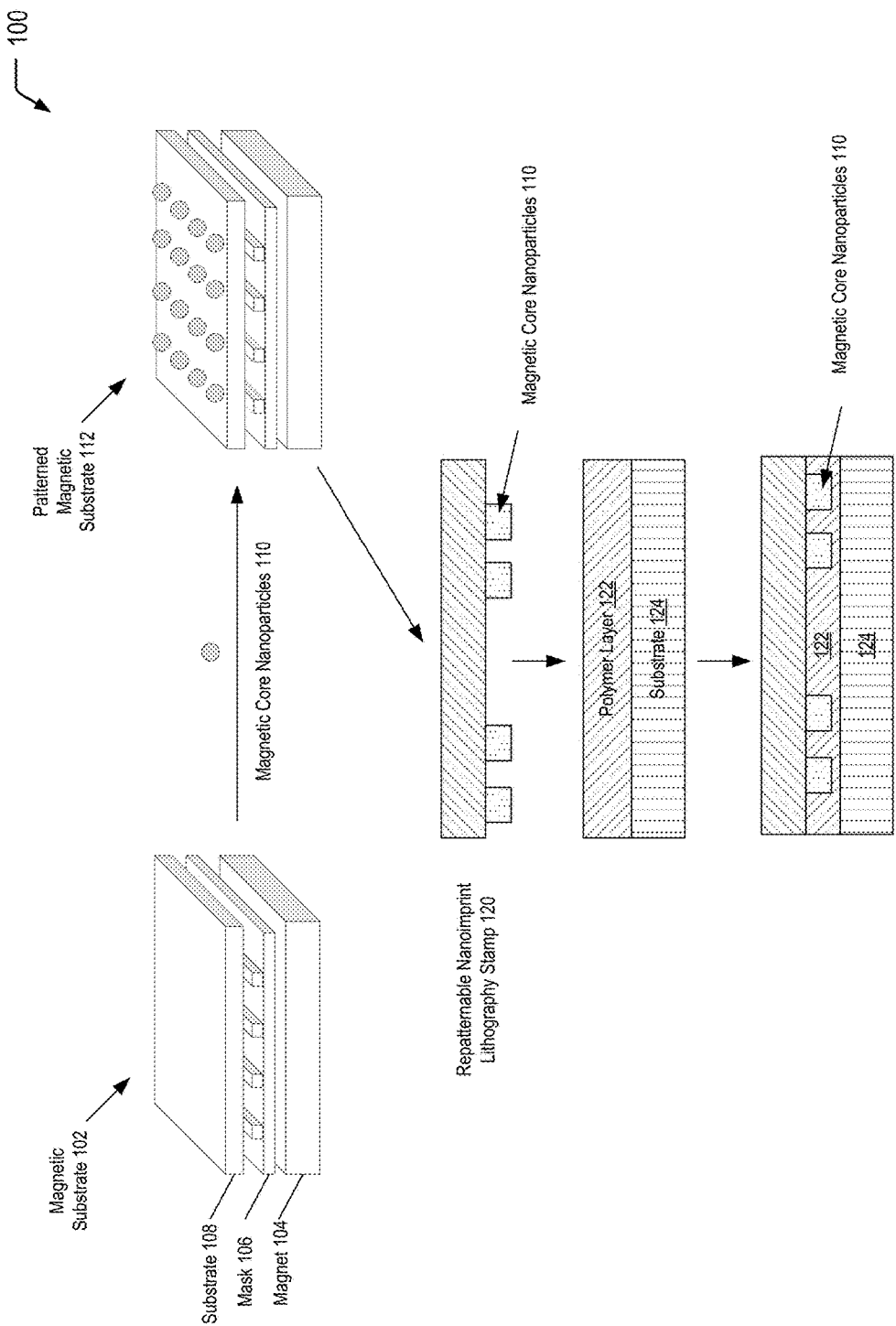
FIG. 1 is a diagram illustrating the formation of a repatternable nanoimprint lithography stamp, according to one embodiment.

The present disclosure describes repatternable nanoimprint lithography stamps and processes of forming repatternable nanoimprint lithography stamps. In the present disclosure, particles containing a magnetic core are used to pattern a rigid stamp for nanoimprint lithography. The particles are easily attracted to a magnetic surface that is used to hold the feature pattern in place. Once that pattern has been placed, the pattern can easily be changed by reversing the polarity of the magnetic surface to liberate particles from that surface. The surface may then be re-magnetically charged to promote adhesion of new particles to the surface in a different pattern or to refresh the original pattern with new particles to promote improved feature definition.

Stamps made from silicon, nickel, soft polymers, polymers, and quartz lack the ability to generate pattern changes as several individual stamps are needed in order to generate different patterns. For example, if a circular pattern is desired, a pattern that is shaped like a circle would be used. If a square pattern is desired, then a square nanoimprint stamp would be used. By contrast, the present disclosure describes repatternable nanoimprint stamps that may be generated on an as-needed basis and that can be refreshed as needed.

In the present disclosure, magnetic core particles (e.g., magnetic core-silica particles) are generated having either a porous or non-porous surface. Porosity of the surface may allow for high surface area features to be generated, as the pores act as a stamping feature as well. Porous particles can be generated having pore size up to 30 nm using known techniques such as processes to form mesoporous silica nanoparticles (e.g., SBA-15). Magnetic core particles with a silica shell can be generated via a modified Stöber preparation where an alkoxysilane, catalyst, and water are used to generate a shell around the magnetic seed particle. Shell thickness can be tailored to improve the magnetic properties of the particles to ensure that the particles will magnetically adhere to the magnetic surface. Particle size can be tailored by either magnetic seed particle size or by silica shell thickness. Various particle sizes may allow for deeper (larger particles) or shallower (smaller particles) imprints when used in the stamp application.

In some cases, after particle generation, the particles may be further surface modified with a surface lubricating agent in order to generate a lubricious surface to prevent the substrate from sticking to the nanoimprint stamp. As an illustrative, non-limiting example, trichloro(3,3,4,4,5,5,6,6,7,7,8,8,9,9,10,10,10-heptadecafluorodecyl)silane may be used to post modify the magnetic core particle surface. In other cases, as described further herein, a bridged flourosilane may also be used to prevent sticking of the substrate to the particle surface. By using a bridged flourosilane, the kinetics of the reaction drive the flourosilane towards the surface of the particle while the alkoxysilane reacts faster, thus forming the particle shell.

Once the particles have been generated, the particles can be patterned onto a magnetic substrate. The magnetic substrate may allow different magnetic patterns to be formed in order to allow the particles to be patterned. By changing the magnetism on the magnetic substrate, a pattern can be formed and changed as desired. As described further herein, the repatternable nanoimprint stamps of the present disclosure may be fabricated using magnetolithography techniques. Magnetolithography is a patterning method based on applying a magnetic field onto a substrate using paramagnetic metal masks. The mask defines the spatial distribution and shape of the applied magnetic field on the substrate. Ferromagnetic nanoparticles are then assembled on the substrate according to the field induced by the magnetic mask and being adsorbed (positive route lithography) or block the surface for further adsorption (negative route lithography) at the defined positions.

Referring to FIG. 1, a diagram 100 illustrates an example of a process of forming a repatternable nanoimprint lithography stamp. In FIG. 1, a magnetolithography technique may be used to form a patterned magnetic substrate (depicted at the top of FIG. 1) that may be utilized as a nanoimprint lithography stamp (depicted at the bottom of FIG. 1). By changing the magnetism on a magnetic substrate, a pattern can be formed, and metallic core particles may be patterned onto the magnetic substrate. After reversing the polarity of the magnetic surface to liberate the magnetic core particles, the magnetic surface may be re-magnetically charged to promote adhesion of new particles to the surface in a different pattern or to refresh the original pattern with new particles to promote improved feature definition.

The first diagram depicted at the top of FIG. 1 illustrates an example of a magnetic substrate 102 that includes a magnet 104, a mask 106, and a substrate 108. The right side of the first diagram illustrates that magnetic core nanoparticles 110 (e.g., ferromagnetic silica nanoparticles) may be utilized to form a patterned magnetic substrate 112 having a pattern of the magnetic core nanoparticles 110 disposed on a surface of the magnetic substrate 102. By selective application of a magnetic field from the magnet 104 via the mask 108, the magnetic core nanoparticles 110 are attracted to the surface of the magnetic substrate 102 in order to hold the feature pattern in place.

In a particular embodiment, the magnetic core nanoparticles 110 may include magnetic core-silica particles having either a porous or non-porous surface. Porosity of the surface may allow for high surface area features to be generated, as the pores act as a stamping feature as well. Porous particles can be generated having pore size up to 30 nm using known techniques such as processes to form mesoporous silica nanoparticles (e.g., SBA-15). Magnetic core particles with a silica shell can be generated via a modified Stöber preparation where an alkoxysilane, catalyst, and water are used to generate a shell around the magnetic seed particle. Shell thickness can be tailored to improve the magnetic properties of the particles to ensure that the particles will magnetically adhere to the magnetic surface. Particle size can be tailored by either magnetic seed particle size or by silica shell thickness. Various particle sizes may allow for deeper (larger particles) or shallower (smaller particles) imprints when used in the stamp application.

Prophetic Example: Formation of Magnetic Core-Silica Particles Via Modified Stöber Process <Particles are prepared through a modified Stöber synthesis using anhydrous ethanol (200 proof), ammonia (2M), deionized water, and tetraethoxysilane (TEOS). TEOS is distilled prior to use. Ethanol (5.38 mL) and TEOS (0.38 mL) were added to a 20 mL scintillation vial and are shaken to mix. In a separate vial, 2M ammonia (3.75 mL) and deionized water (0.49 mL) are added and shaken to mix. To the ammoniacal solution, magnetic nanoparticles (e.g., ferric oxide) (0.114 g) is added. The magnetic particle/ammoniacal solution is then poured into the monomer solution and shaken for 10 seconds. Vials are then stirred for 24 h. After the reaction period, particles can be centrifuged and rinsed with ethanol at least 3 times to remove residual monomer yielding magnetic core-silica nanoparticles>

In some cases, after particle generation, the magnetic core nanoparticles 110 may be further surface modified in order to generate a lubricious surface to prevent the substrate 108 from sticking to the nanoimprint stamp. As an illustrative, non-limiting example, trichloro(3,3,4,4,5,5,6,6,7,7,8,8,9,9,10,10,10-heptadecafluorodecyl)silane may be used to post modify the magnetic core particle surface. In other cases, as described further herein with respect to FIGS. 2 and 3, a bridged flourosilane may also be used to prevent sticking of the substrate to the particle surface. By using a bridged flourosilane, the kinetics of the reaction drive the flourosilane towards the surface of the particle while the alkoxysilane reacts faster, thus forming the particle shell.

After particle generation, the magnetic core nanoparticles 110 can be patterned onto the magnetic substrate 102 to form the patterned magnetic substrate 112. The magnetic substrate 102 may allow different magnetic patterns to be formed in order to allow the magnetic core nanoparticles 110 to be patterned. By changing the magnetism on the magnetic substrate 102, a pattern can be formed and changed as desired. Magnetolithography is a patterning method based on applying a magnetic field onto a substrate using paramagnetic metal masks. The mask 106 defines the spatial distribution and shape of the applied magnetic field on the substrate 108. As shown on the right side of the first diagram depicted at the top of FIG. 1, the magnetic core nanoparticles 110 are then assembled on the substrate 108 according to the field induced by the magnetic mask 106.

The second diagram depicted at the bottom of FIG. 1 illustrates the patterned magnetic substrate 112 being utilized as a repatternable nanoimprint lithography stamp 120 to pattern a polymer layer 122 disposed on a substrate 124 (e.g., a semiconductor wafer). The pattern formed on the polymer layer 122 corresponds to the pattern of the magnetic core nanoparticles 110 adhered to magnetic substrate 112.

While not shown in FIG. 1, after utilizing the repatternable nanoimprint lithography stamp 120 to pattern the polymer layer 122, the repatternable nanoimprint lithography stamp 120 may be removed. After removal, the polarity of the magnet 104 may be reversed to remove the magnetic core nanoparticles 110 from the surface of the magnetic substrate 102. After reversing the polarity of the magnetic surface to liberate the magnetic core nanoparticles 110, the magnetic surface may be re-magnetically charged to promote adhesion of new particles to the surface in a different pattern or to refresh the original pattern with new particles to promote improved feature definition.

Thus, FIG. 1 illustrates an example of a process of forming a repatternable nanoimprint lithography stamp that includes magnetic core nanoparticles that are arranged in a pattern using a magnetic mask. After utilizing the nanoimprint lithography stamp to form a corresponding pattern in a polymer layer, the polarity of the magnetic surface may be reversed to liberate the magnetic core particles. In some cases, the magnetic surface may be re-magnetically charged in order to promote adhesion of new particles to re-pattern the surface in a different pattern. In other cases, the magnetic surface may be re-magnetically charged in order to refresh the original pattern with new particles to promote improved feature definition.

Figure 2:
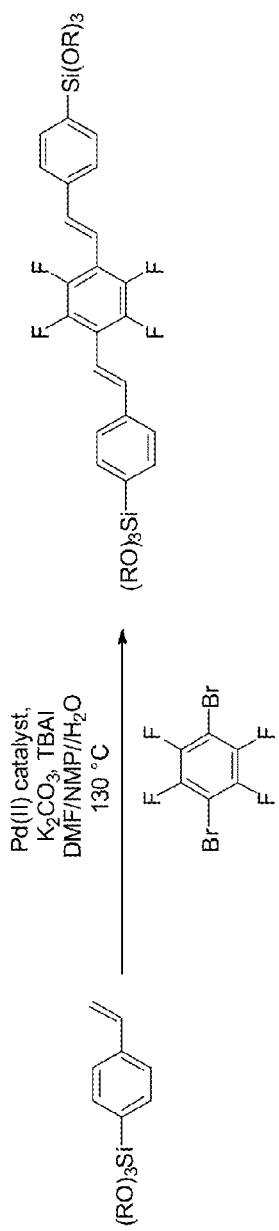
FIG. 2 is a chemical reaction diagram illustrating optional surface modification of magnetic core particles of the repatternable nanoimprint lithography stamp in order to generate a lubricious surface on the magnetic core particles, according to one embodiment.

Referring to FIG. 2, a chemical reaction diagram 200 depicts a first example of surface modification of magnetic core particles. After generation of the magnetic core nanoparticles 110 (as described herein with respect to FIG. 1), the magnetic core nanoparticles 110 may be further surface modified in order to generate a lubricious surface to prevent the substrate 108 from sticking to the nanoimprint stamp.

FIG. 2 depicts an example of the synthesis of a vinyl-bridged flourosilane using a modified Heck cross-coupling reaction. By using a bridged flourosilane, the kinetics of the reaction drive the flourosilane towards the surface of the particle while the alkoxysilane reacts faster, thus forming the particle shell.

Prophetic Example

A reaction vessel may be charged with the following: 1,4-dibromo-2,3,5,6-tetraflourobenzene (1.0 equiv.); trialkoxy(4-vinylphenyl)silane (>2.0 equiv.); a base, such as calcium carbonate or potassium carbonate (>2.0 equiv.); a polar aprotic solvent, such as N-methylpyrrolidone (NMP) or N,N-dimethylformamide (DMF); $H_2O$, a solution of a palladium catalyst, such as 1-Butanaminium, N,N,N-tributyl-di-µ-bromodibromobis(pent afluorophenyl)dipalladate (2-) (2:1) (CAS#165881-25-4), dihydrogen di-µ-chlorotetrakis(di-tert-butylphosphinito-kP)dipalladate (5 mol %) in the same solvent as above; a phase transfer agent, such as tetrabutylammonium iodide (0.5 equiv.); and an inert atmosphere. The reaction mixture may be heated to 130° C. and stirred for up to 24 hours. The reaction may be monitored by $^{19}F$ NMR. Upon completion, the mixture may be cooled to room temperature and poured into water. The aqueous solution may be acidified with 2N HCl and extracted with ether (2×). The extract may be washed with saturated sodium chloride and then dried over anhydrous $Na_2SO_4$, followed by evaporation of ether, followed by flash chromatography.

Thus, FIG. 2 illustrates an example of a surface modifier for magnetic core particles that can be used to generate a lubricious surface to prevent the magnetic substrate from sticking to the nanoimprint lithography stamp.

Figure 3:
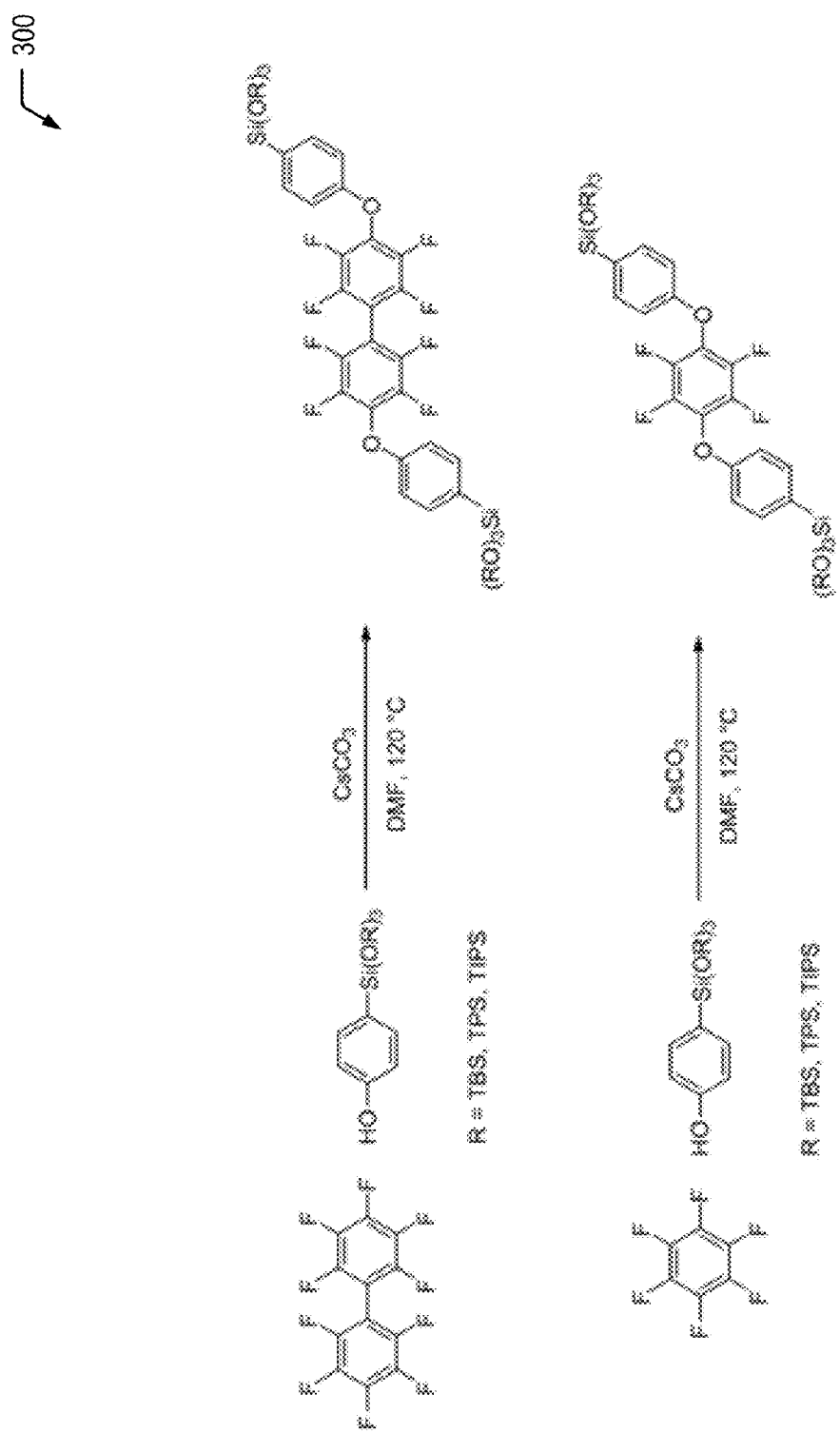
FIG. 3 is a chemical reaction diagram illustrating optional surface modification of magnetic core particles of the repatternable nanoimprint lithography stamp in order to generate a lubricious surface on the magnetic core particles, according to one embodiment.

Referring to FIG. 3, a chemical reaction diagram 300 depicts alternative examples of surface modifiers for magnetic core particles. After generation of the magnetic core nanoparticles 110 (as described herein with respect to FIG. 1), the magnetic core nanoparticles 110 may be further surface modified in order to generate a lubricious surface to prevent the substrate 108 from sticking to the nanoimprint stamp.

FIG. 3 depicts examples of the synthesis of an ether-bridged flourosilane. In FIG. 3, the two related ether-bridged flourosilanes are produced using nucleophilic aromatic substitution of silane functionalized phenol on either perflourobiphenyl (depicted in the first chemical reaction at the top of FIG. 3) or perflourobenzene (depicted in the second chemical reaction at the bottom of FIG. 3). By using a bridged flourosilane, the kinetics of the reaction drive the flourosilane towards the surface of the particle while the alkoxysilane reacts faster, thus forming the particle shell.

Prophetic Example

A reaction vessel may be charged with the following: hexafluorobenzene or decaflourobiphenyl (1 equiv.); a base, such as sodium hydroxide, potassium carbonate, or cesium carbonate (>2.0 equiv.); trialkoxy(4-hydroxyphenyl)silane (3.0 eq.); and a polar, high-boiling solvent, such as DMF or DMAc. The reaction mixture may be placed under an inert atmosphere and heated at 130° C. for 24 hours. Once cooled to room temperature, the mixture may be poured into an excess of warm (40° C.) water. The resulting solid may be collected by filtration, and the crude material may be washed with several portions of warm water (40° C.) and then purified by either recrystallization, sublimation, or column chromatography.

Thus, FIG. 3 illustrates an example of surface modification of magnetic core particles to generate a lubricious surface to prevent the magnetic substrate from sticking to the nanoimprint lithography stamp.

Figure 4:
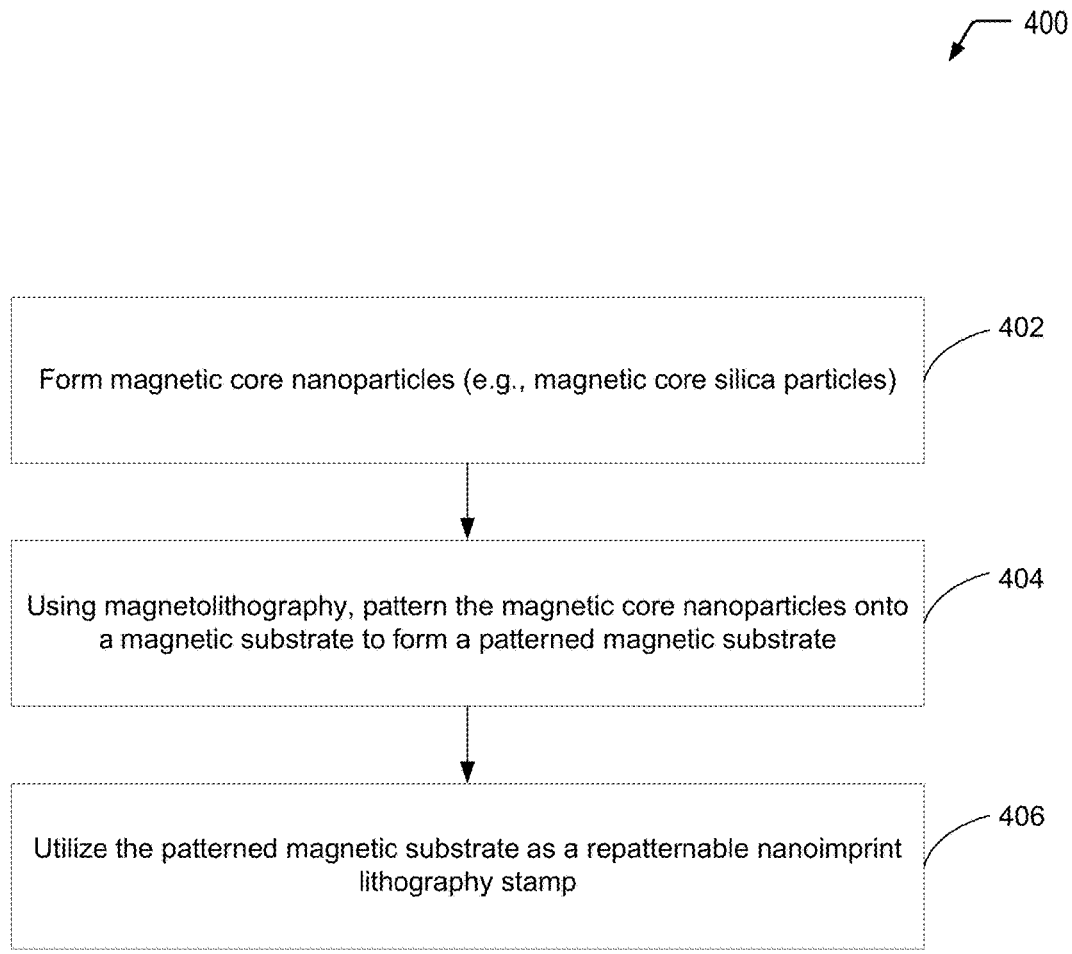
FIG. 4 is a flow diagram showing a particular embodiment of a process of forming a repatternable nanoimprint lithography stamp.

Referring to FIG. 4, a flow diagram illustrates an exemplary process 400 of forming a repatternable nanoimprint lithography stamp, according to a particular embodiment. In a particular embodiment, the repatternable nanoimprint lithography stamp may correspond to the repatternable nanoimprint lithography stamp 120 illustrated and described further herein with respect to FIG. 1.

In the particular embodiment illustrated in FIG. 4, operations associated with an example process of forming a patterned magnetic substrate for use as a nanoimprint lithography stamp are identified as operations 402-404, while operations associated with the utilization of the nanoimprint lithography stamp are identified as operation 406. It will be appreciated that the operations shown in FIG. 4 are for illustrative purposes only and that the operations may be performed by a single entity or by multiple entities. As an example, one entity may form the magnetic core particles, while another entity may utilize the magnetic core particles to form a patterned magnetic substrate for use as a nanoimprint lithography stamp. Further, while not shown in the example of FIG. 4, in some cases, the magnetic core nanoparticles may be surface modified in order to generate a lubricious surface to prevent the magnetic substrate from sticking to the stamp (as described further herein with respect to FIGS. 2 and 3). In these cases, one entity may form the magnetic core particles, while the same entity or a different entity may perform operations associated with surface modification of the particles.

The process 400 includes forming magnetic core particles, at 402. For example, referring to FIG. 1, the magnetic core nanoparticles 110 may be formed via a modified Stöber synthesis procedure, as described further herein. In some cases, after particle formation, the magnetic core nanoparticles 110 may be surface modified in order to generate a lubricious surface to prevent the magnetic substrate 102 from sticking to the stamp 120 (e.g., as described further herein with respect to FIGS. 2 and 3).

The process 400 includes utilizing magnetolithography to pattern the magnetic core particles onto a magnetic substrate to form a patterned magnetic substrate, at 404. For example, referring to the diagram illustrated at the top of FIG. 1, the magnetic core nanoparticles 110 may be patterned onto the magnetic substrate 102 to form the patterned magnetic substrate 112.

The process 400 includes utilizing the patterned magnetic substrate as a repatternable nanoimprint lithography stamp, at 406. For example, referring to the diagram illustrated at the bottom of FIG. 1, the patterned magnetic substrate 112 may be utilized as the repatternable nanoimprint lithography stamp 120 to form a pattern in the polymer layer 122.

Thus, FIG. 4 illustrates an example of a process of forming a repatternable nanoimprint lithography stamp. While not shown in the embodiment depicted in FIG. 4, after utilization of the repatternable nanoimprint lithography stamp, the patterned magnetic core particles may be removed and replaced with other magnetic core particles (in the same pattern or a different pattern).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A process comprising:
forming a patterned magnetic substrate that includes magnetic core nanoparticles arranged in a pattern on a surface of a magnetic substrate, wherein the magnetic substrate includes a magnet and a magnetic mask, and wherein the pattern of the magnetic core nanoparticles is defined by selective application of a magnetic field to the magnetic substrate using the magnet and the magnetic mask; and
removing the magnetic core nanoparticles from the surface of the magnetic substrate; and
forming a second patterned magnetic substrate that includes magnetic core nanoparticles arranged in a second pattern on the surface of the magnetic substrate; and
utilizing the second patterned magnetic substrate as a second repatternable nanoimprint lithography stamp.

2. The process of claim 1, further comprising removing the magnetic core nanoparticles from the surface of the magnetic substrate by reversing a polarity of the magnetic field.

3. The process of claim 1, wherein the pattern of the magnetic core nanoparticles prior to removal of the magnetic core nanoparticles corresponds to the second pattern.

4. The process of claim 1, wherein the pattern of the magnetic core nanoparticles prior to removal of the magnetic core nanoparticles is different from the second pattern.

5. The process of claim 1, wherein the magnetic core nanoparticles include magnetic core-silica particles.

6. The process of claim 5, wherein the magnetic core-silica particles are surface modified with a surface lubricating agent.

7. The process of claim 6, wherein the surface lubricating agent includes trichloro(3,3,4,4,5,5,6,6,7,7,8,8,9,9,10,10,10-heptadecafluorodecyl)silane or a bridged flourosilane.

8. The process of claim 1, wherein the magnetic core nanoparticles have a porous surface.

9. The process of claim 8, wherein the porous surface has pores with a pore size of not greater than 30 nm.

10. The process of claim 9, wherein the magnetic core nanoparticles correspond to mesoporous silica nanoparticles.

11. A nanoimprint lithography process comprising:
forming a patterned magnetic substrate that includes magnetic core nanoparticles arranged in a first pattern on a surface of a magnetic substrate, wherein the magnetic substrate includes a magnet and a magnetic mask, and wherein the first pattern of the magnetic core nanoparticles is defined by selective application of a magnetic field to the magnetic substrate using the magnet and the magnetic mask;
utilizing the patterned magnetic substrate to perform a first nanoimprint lithography stamping operation;
removing the magnetic core nanoparticles from the surface of the magnetic substrate by reversing a polarity of the magnetic field;
forming a second patterned magnetic substrate that includes magnetic core nanoparticles arranged in a second pattern on the surface of the magnetic substrate; and
utilizing the second patterned magnetic substrate to perform a second nanoimprint lithography operation.

12. The nanoimprint lithography process of claim 11, wherein the first pattern corresponds to the second pattern.

13. The nanoimprint lithography process of claim 11, wherein the first pattern is different from the second pattern.

14. The nanoimprint lithography process of claim 11, wherein the magnetic core nanoparticles include magnetic core-silica particles that are surface modified with a surface lubricating agent.

15. The nanoimprint lithography process of claim 14, wherein the surface lubricating agent includes trichloro(3,3,4,4,5,5,6,6,7,7,8,8,9,9,10,10,10-heptadecafluorodecyl)silane or a bridged flourosilane.

16. The nanoimprint lithography process of claim 11, wherein the magnetic core nanoparticles have a porous surface.

17. The nanoimprint lithography process of claim 16, wherein the porous surface has pores with a pore size of not greater than 30 nm.

18. The nanoimprint lithography process of claim 17, wherein the magnetic core nanoparticles correspond to mesoporous silica nanoparticles.

* * * * *